United States Patent
Chen

(10) Patent No.: US 7,346,088 B2
(45) Date of Patent: Mar. 18, 2008

(54) VOLTAGE DIVIDING APPARATUS FOR PREVENTING SUDDEN INCREASES IN POWER TO A LASER DIODE

(76) Inventor: Sheng-Ho Chen, 13F-6, No. 456, Chungho Rd., Chungho City, Taipei Hsien (TW)

( * ) Notice: Subject to any disclaimer, the term of this patent is extended or adjusted under 35 U.S.C. 154(b) by 187 days.

(21) Appl. No.: 11/211,663

(22) Filed: Aug. 26, 2005

(65) Prior Publication Data

US 2006/0198409 A1    Sep. 7, 2006

(30) Foreign Application Priority Data

Mar. 4, 2005    (TW) .............................. 94203345 A

(51) Int. Cl.
*H01S 3/00*    (2006.01)

(52) U.S. Cl. ............... 372/38.01; 372/38.1; 372/38.02; 372/38.07; 372/38.09; 372/29.011

(58) Field of Classification Search ............. 372/38.01, 372/38.02, 38.07, 38.09, 29.011, 38.1
See application file for complete search history.

(56) References Cited

U.S. PATENT DOCUMENTS

| | | | |
|---|---|---|---|
| 3,806,762 A * | 4/1974 | Punis et al. ................. | 315/307 |
| 4,409,473 A * | 10/1983 | Furuta et al. ............... | 250/206 |
| 5,163,063 A * | 11/1992 | Yoshikawa et al. ...... | 372/38.02 |
| 5,182,756 A * | 1/1993 | Waki et al. ............... | 372/38.02 |
| 5,341,086 A * | 8/1994 | Fukudome .................. | 323/273 |
| 5,541,500 A * | 7/1996 | Krahl ......................... | 323/299 |
| 5,793,786 A * | 8/1998 | Furumiya ................ | 372/38.02 |
| 5,808,425 A * | 9/1998 | Harle ......................... | 315/381 |
| 5,859,862 A * | 1/1999 | Hikasa et al. ............ | 372/38.02 |
| 6,031,855 A * | 2/2000 | Watanabe ................ | 372/38.02 |
| 2002/0118716 A1* | 8/2002 | Furudate et al. .......... | 372/38.02 |
| 2003/0080805 A1* | 5/2003 | Kaminishi .................. | 327/538 |
| 2004/0075474 A1* | 4/2004 | Umeda et al. .............. | 327/112 |

\* cited by examiner

*Primary Examiner*—Minsun Oh Harvey
*Assistant Examiner*—Joahua J King
(74) *Attorney, Agent, or Firm*—Rosenberg, Klein & Lee

(57) ABSTRACT

A voltage dividing apparatus for preventing sudden increases in power to a laser diode includes a laser diode module, a laser-driving unit and a Zener diode. The laser diode module includes a laser diode for receiving a driving current to emit light, and a photo diode for receiving the light emitted from the laser diode and transferring the light signal into a voltage signal. The voltage signal is fed back to the laser diode module for automatically balancing the power of the laser diode. The laser-driving unit is used for driving the laser diode to output power. When the circuit shorts, two voltage-dividing resistors and the Zener diode disable the laser-driving unit to protect the laser diode. It blocks the laser diode's outputting power to prevent the outputting power from suddenly increasing and prevent the laser with strong power from hurting a user's eyes.

6 Claims, 5 Drawing Sheets

| testing voltage: | DC3.0V |
|---|---|
| | unit: mW |
| rating power | 0.8 |
| R1 on short | 0.84 |
| R2 on short | 0.79 |
| R3 on short | 0.16 |
| R4 on short | 0.03 |
| R5 on short | 0 |
| Q1(C-Eon short) | 0 |
| Q1(C-Bon short) | 0 |
| Q1(E-Bon short) | 0 |
| Q2(C-Eon short) | 0.84 |
| Q2(C-Bon short) | 0 |
| Q2(E-Bon short) | 0 |
| Q3(C-Eon short) | 0.82 |
| Q3(C-Bon short) | 0 |
| Q3(E-Bon short) | 0 |
| Q4(C-Eon short) | 0.8 |
| Q4(C-Bon short) | 0 |
| Q4(E-Bon short) | 0 |
| Q5(C-Eon short) | 0 |
| Q5(C-Bon short) | 0 |
| Q5(E-Bon short) | 0.8 |
| D1on short | 0 |
| LD-PDon short | 0 |
| LD-VCCon short | 0 |
| PD-VCCon short | 0 |

FIG 4A

| testing voltage: | DC3.0V |
|---|---|
| | unit:mW |
| rating power | 0.8 |
| R1' on short | 0.86 |
| R2' on short | 0.78 |
| R3' on short | 0.03 |
| R4' on short | 0 |
| Q1' (C-Eon short) | 0 |
| Q1' (C-Bon short) | 0 |
| Q1' (E-Bon short) | 0 |
| Q2' (C-Eon short) | 0.88 |
| Q2' (C-Bon short) | 0 |
| Q2' (E-Bon short) | 0 |
| Q3' (C-Eon short) | 0.82 |
| Q3' (C-Bon short) | 0 |
| Q3' (E-Bon short) | 0 |
| Q4' (C-Eon short) | 0 |
| Q4' (C-Bon short) | 0 |
| Q4' (E-Bon short) | 0.8 |
| D1' on short | 0 |
| LD-PDon short | 0 |
| LD-VCCon short | 0 |
| PD-VCCon short | 0 |
| | |
| | |
| | |
| | |

FIG 4B

VOLTAGE DIVIDING APPARATUS FOR PREVENTING SUDDEN INCREASES IN POWER TO A LASER DIODE

BACKGROUND OF THE INVENTION

1. Field of the Invention

The present invention relates to a voltage dividing apparatus for preventing sudden increases in power to a laser diode. In particular, this voltage dividing apparatus uses a Zener diode to prevent any overshooting of power to a laser diode when the laser diode shorts. It also uses voltage-dividing resistors that connect with the laser-driving unit in parallel to distribute voltage to each component of the laser-driving unit. Therefore, the voltage of each component of the laser-driving unit will not suddenly overshoot when outputting power exceeds specifications.

2. Description of the Related Art

FIG. 1 shows a circuit diagram of a laser diode module of the prior art. When any component of the laser diode module shorts, the control of the laser diode module fails. Therefore, the outputting power of the laser diode module suddenly increases and exceeds its specifications.

The laser diode module of the prior art has the following shortcomings:

1. When any component of the laser diode module shorts, the control of the laser diode module fails, subsequently the outputting power of the laser diode module suddenly increases and exceeds its specifications.

2. When any component of the laser diode module shorts, the outputting power of the laser diode module is very high and damages a user's eyes.

SUMMARY OF THE INVENTION

One particular aspect of the present invention is to provide a voltage dividing apparatus for preventing sudden increases in power to a laser diode. When the apparatus shorts, it uses a Zener diode to protect the laser diode module and prevent the outputting power of the laser diode module from suddenly increasing.

Another particular aspect of the present invention is to provide a voltage dividing apparatus for preventing sudden increases in power to a laser diode. The apparatus uses voltage-dividing resistors that connect with the laser-driving unit in parallel to distribute voltage to each component of the laser-driving unit. Therefore, the voltage of the each component of the laser-driving unit will not suddenly overshoot when outputting power exceeds specifications when the component shorts.

The voltage dividing apparatus for preventing sudden increases in power to a laser diode includes a laser diode module, a laser-driving unit and a Zener diode. The laser diode module includes a laser diode for receiving a driving current to emit light, and a photo diode for receiving light emitted from the laser diode and transferring the light signal into a voltage signal. The voltage signal is fed back to the laser diode module for automatically balancing the power of the laser diode. The laser-driving unit connects with the laser diode for driving the laser diode to output power. Two voltage-dividing resistors connect with the laser-driving unit in parallel for distributing voltage into each component of the laser-driving unit. The Zener diode connects with the voltage-dividing resistors. When the circuit shorts, the Zener diode disables the laser-driving unit to protect the laser diode. Therefore, it blocks the output of the laser diode's power to prevent the outputting power from suddenly increasing.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows:

FIG. 4A is a figure diagram of the testing results when the first embodiment of the voltage dividing apparatus for preventing sudden increases in power to a laser diode of the present invention shorts FIG. 4B is a figure diagram of the testing results when the second embodiment of the voltage dividing apparatus for preventing sudden increases in power to a laser diode of the present invention shorts.

DETAILED DESCRIPTION OF THE PREFERRED EMBODIMENTS

Figure 1:
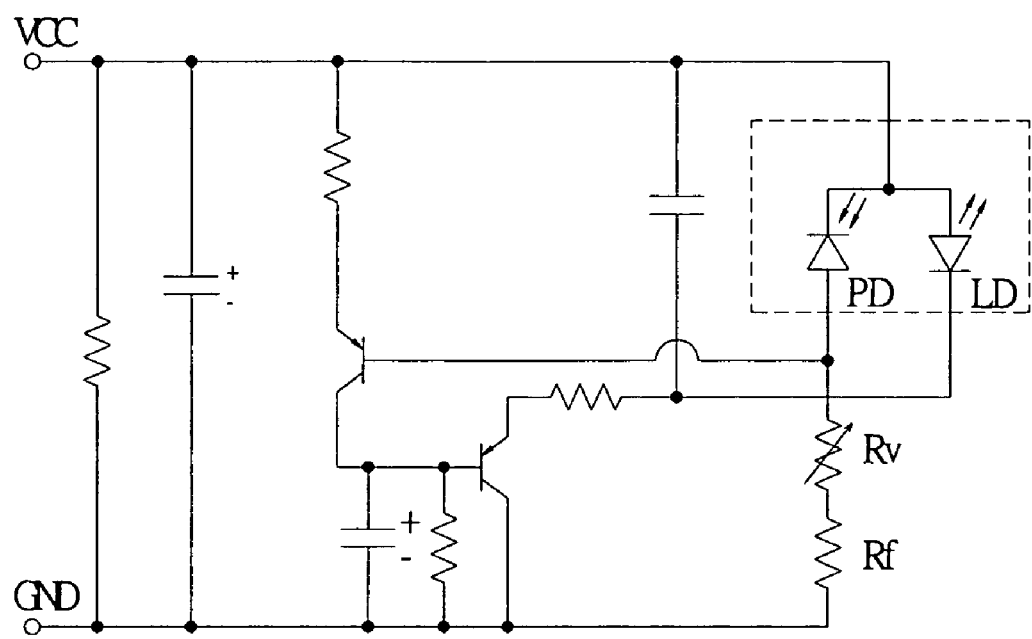
FIG. 1 is a circuit diagram of a laser diode module of the prior art.
Figure 2:
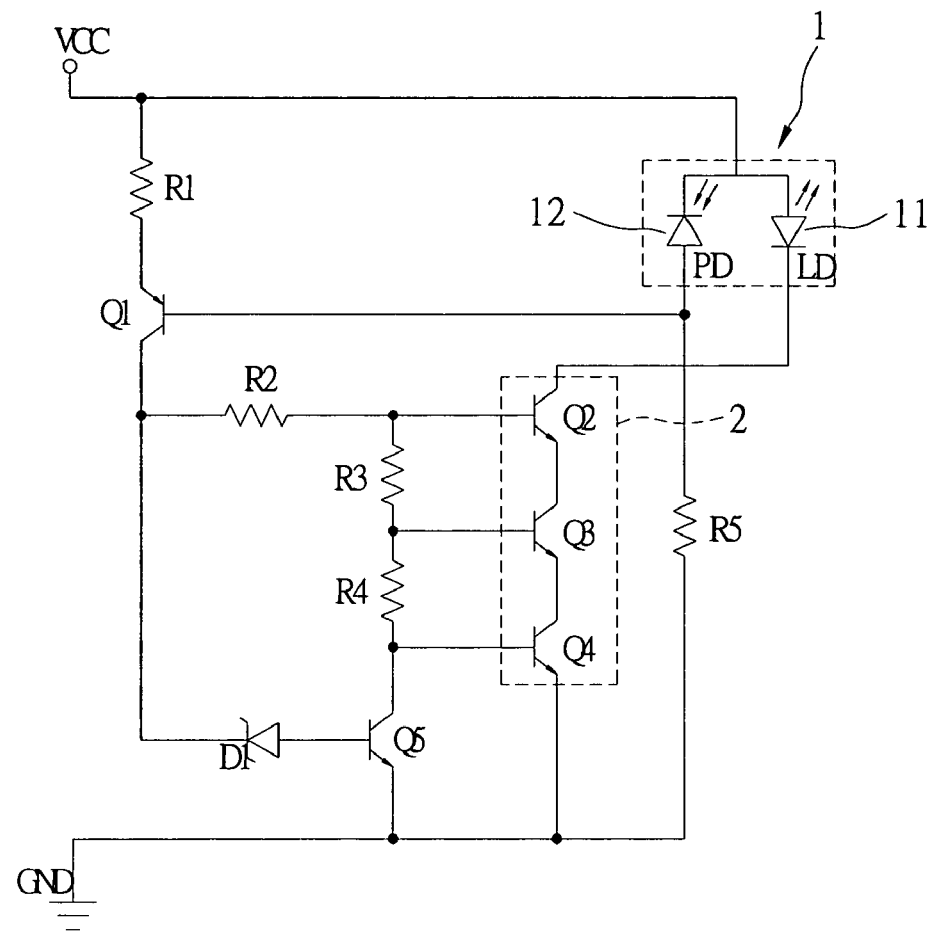
FIG. 2 is a circuit diagram of the first embodiment of the voltage dividing apparatus for preventing sudden increases in power to a laser diode of the present invention.

FIG. 2 shows a circuit diagram of the first embodiment of the voltage dividing apparatus for preventing sudden increases in power to a laser diode of the present invention. The voltage dividing apparatus for preventing sudden increases in power to a laser diode includes a laser diode module 1, a laser-driving unit 2 that is composed of transistors Q2, Q3 and Q4, two voltage-dividing resistors R3 and R4 and a Zener diode D1. The laser diode module 1 includes a laser diode 11 and a photo diode 12. The Zener voltage of the Zener diode D1 is 1.2 voltages.

The laser diode module 1 is driven by an external direct voltage. The laser diode 11 receives a driving current to emit light. The photo diode 12 receives the light emitted from the laser diode 11 and transfers the light signal into a voltage signal. The voltage signal is fed back to the laser diode module 1 for automatically balancing the power of the laser diode 11. The laser-driving unit 2 (including transistors Q2, Q3 and Q4) connects with the laser diode 11. The voltage-dividing resistors R3 and R4 connect with the laser-driving unit 2 in parallel. The resistance of the voltage-dividing resistors R3 and R4 are adjusted with a predetermined ratio to distribute voltage between the transistors Q2, Q3 and Q4.

The Zener diode Z1 and a bipolar junction transistor Q5 connect with the voltage-dividing resistors R3 and R4. When the circuit shorts, the bipolar junction transistor Q5 disables the transistors Q2, Q3 and Q4 to protect the laser diode module 1 and prevent the outputting power of the laser diode from suddenly increasing. The laser-driving unit 2 is composed of three bipolar junction transistors Q2, Q3 and Q4 that are connected together in serial.

The photo diode 12 connects with a circuit that is composed of a resistor R1 and a PNP bipolar junction transistor Q1, and a feedback resistor R5 is grounded. The resistor R1 connects with a PNP bipolar junction transistor Q1 in serial. Another end of the resistor RI connects with an external direct voltage. When the circuit works normally, the external direct voltage drives the laser diode module 1 directly to make the laser diode 11 receive a driving current for emitting light. At the same time, the photo diode 12 receives the light emitted from the laser diode 11 and transfers the light signal into a voltage signal. Therefore, the voltage signal is used for controlling the PNP bipolar junction transistor Q1 and feeds the voltage signal back to the laser diode module 1 to automatically balance the outputting power.

The external direct voltage drives the circuit that is composed of the resistor R1 and the PNP bipolar junction transistor Q1. The circuit connects with the voltage-dividing resistors R3 and R4 and the laser-driving unit 2 (including the transistors Q2, Q3 and Q4) via a resistor R2. The voltage-dividing resistors R3 and R4 connect with the laser-driving unit 2 (including the transistors Q2, Q3 and Q4) in parallel. By adjusting the resistance of the voltage-dividing resistors R3 and R4 to a predetermined ratio, the voltage is distributed between the transistors Q2, Q3 and Q4.

When the laser diode module or the PNP bipolar junction transistor Q1 works on short condition, the voltage of the collector of the PNP bipolar junction transistor Q1 suddenly increases and is larger than a breakdown voltage of the Zener diode Z1. Therefore the Zener diode Z1 works and drives the bipolar junction transistor Q5 for disabling the transistors Q2, Q3 and Q4. Then, the laser diode module 1 is protected and the outputting power of the laser diode 11 is abandoned/drops to prevent the outputting power from suddenly increasing.

Figure 3:
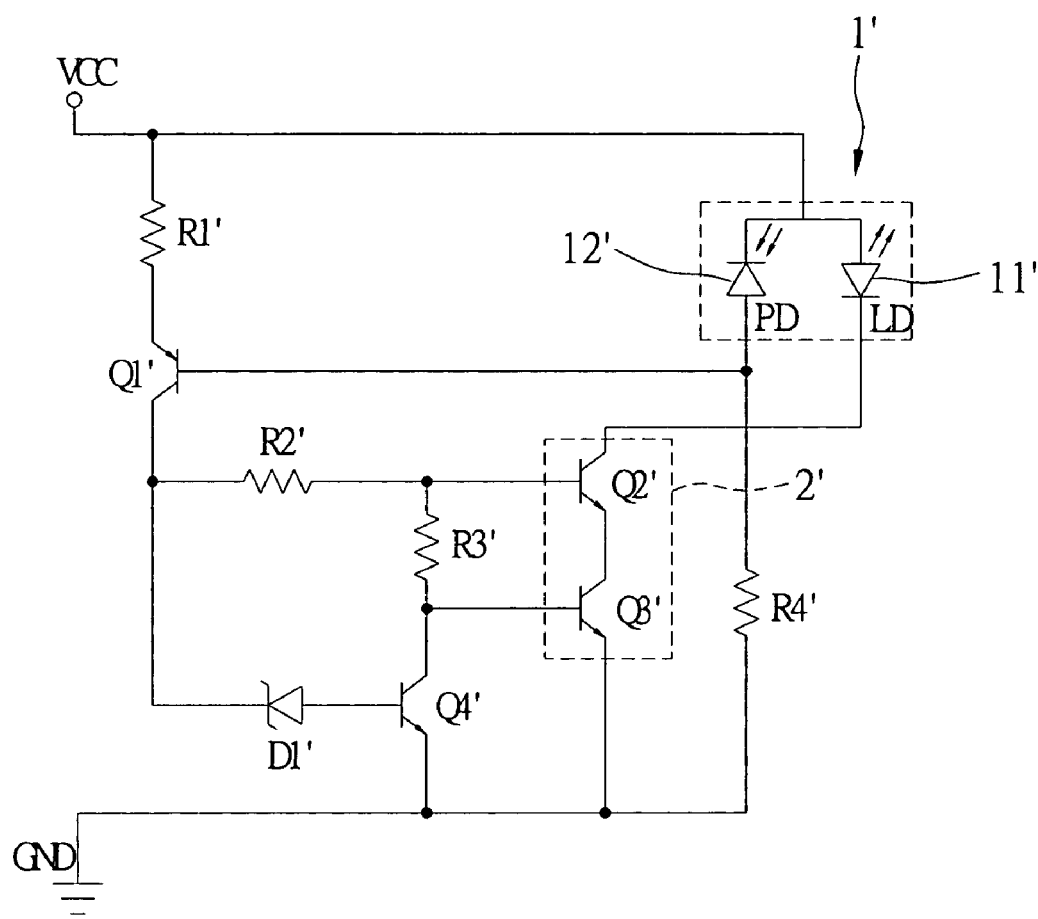
FIG. 3 is a circuit diagram of the second embodiment of the voltage dividing apparatus for preventing sudden increases in power to a laser diode of the present invention.

FIG. 3 shows a circuit diagram of the second embodiment of the voltage dividing apparatus for preventing sudden increases in power to a laser diode of the present invention. The voltage dividing apparatus for preventing sudden increases in power to a laser diode includes a laser diode module 1', a laser-driving unit 2' that is composed of transistors Q2' and Q3', and a Zener diode D1'. The laser diode module 1' includes a laser diode 11' and a photo diode 12'.

The laser diode module 1' is driven by an external direct voltage. The laser diode 11' receives a driving current to emit light. The photo diode 12' receives the light emitted from the laser diode 11' and transfers the light signal into a voltage signal. The voltage signal is used for controlling a bipolar junction transistor Q1' and is fed back to the laser diode module 1' for automatically balancing the power of the laser diode 11'. The laser-driving unit 2' (including transistors Q2' and Q3') connects with the laser diode 11'. A voltage-dividing resistor R3 connects with the laser-driving unit 2' (including transistors Q2' and Q3') in parallel. The resistance of the voltage-dividing resistors R2' and R3' are adjusted with a predetermined ratio to distribute voltage between the transistors Q2' and Q3'.

The Zener diode Z1' and a bipolar junction transistor Q4' connect with the voltage-dividing resistor R3'. When the circuit shorts, the bipolar junction transistor Q4' disables the transistors Q2' and Q3' to protect the laser diode module 1' and prevent the outputting power of the laser diode 11' from suddenly increasing. The laser-driving unit 2' is composed of two bipolar junction transistors Q2' and Q3' that connect together in serial.

The photo diode 12' connects with a circuit that is composed of a resistor R1' and a PNP bipolar junction transistor Q1', and a feedback resistor R5' that connects with ground. The resistor R1' connects with a PNP bipolar junction transistor Q1' in serial. Another end of the resistor R1' connects with an external direct voltage. When the circuit works normally, the external direct voltage drives the laser diode module 1' directly to make the laser diode 11' receive a driving current for emitting light. At the same time, the photo diode 12' receives the light emitted from the laser diode 11' and transfers the light signal into a voltage signal. Therefore, the voltage signal is used for controlling the PNP bipolar junction transistor Q1' to automatically balance the outputting power. The external direct voltage drives the circuit that is composed of the resistor R1' and the PNP bipolar junction transistor Q1'. The circuit connects with the voltage-dividing resistor R3' and the laser-driving unit 2' (including the transistors Q2' and Q3') via the voltage-dividing resistor R2'.

When the laser diode module or the PNP bipolar junction transistor Q1' works on short condition, the voltage of the collector of the PNP bipolar junction transistor Q1' increases suddenly and is larger than a breakdown voltage of the Zener diode Z1'. Therefore the Zener diode Z1' works and enables the bipolar junction transistor Q4' for disabling the transistors Q2' and Q3'. In this way, the laser diode module 1' is protected.

FIGS. 4A and 4B show figure diagrams of the testing results when the first and second embodiment of the voltage dividing apparatus for preventing sudden increases in power to a laser diode of the present invention is operated on short condition. In the figures, the C-E on short means the collector and the emitter of a transistor are on short and the C-B on short means the collector and the base of a transistor are on short. The meaning of the/any others is the same as described above. The figures show the outputting power of the laser diode module 1 or the laser diode module 1' when the testing voltage (the external direct voltage VCC) is 3V and the test points are on short/are/have been shorted. Due to the protective function of the Zener diode Z1 or a Zener diode Z1', the outputting power of the laser diode module 1 or the laser diode module 1' is limited and stays within its specifications, or either the laser diode module 1 or the laser diode module 1' is disabled directly.

The present invention has the following characteristics:

1. When the circuit shorts, the voltage dividing apparatus for preventing sudden increases in power to a laser diode uses a Zener diode to protect the laser diode module and prevent the outputting power of the laser diode module from suddenly increasing. Therefore, the user life of the laser diode module is enhanced and the laser cannot hurt a user's eyes.

2. The voltage dividing apparatus for preventing sudden increases in power to a laser diode uses voltage-dividing resistors that connect with the laser-driving unit in parallel to distribute voltage. It prevents the outputting power from suddenly increasing when a component of the laser-driving unit shorts and limits the outputting power within safe specifications.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A voltage dividing apparatus for preventing sudden increases in power to a laser diode, comprising:
   a laser diode module, including:
     a laser diode, for receiving a driving current to emit light; and a photo diode, for receiving light emitted from the laser diode and converting the received light into a voltage signal;

a feedback amplifying circuit having an input coupled to the photo diode for providing a feedback voltage signal responsive to the voltage signal from the photo diode to automatically balance power of the laser diode;

a laser-driving unit having an output connected to the laser diode, and an input coupled to an output of the feedback amplifying circuit for controlling a current of the laser diode responsive to the feedback voltage signal;

a voltage distribution circuit providing coupling between the feedback amplifying circuit and the laser driving unit, the voltage distribution circuit including two series connected voltage-dividing resistors connected with the laser-driving unit for proportionally distributing the feedback voltage signal into each component of the laser-driving unit; and a feedback voltage monitoring circuit having an input coupled to the feedback amplifying circuit and an output coupled to the voltage distribution circuit and the laser-driving unit, the feedback voltage monitoring circuit including (a) a transistor coupled to the voltage-dividing resistors and the laser driving unit, and (b) a Zener diode coupled between the output of the feedback amplifying circuit and the transistor, wherein a short circuit causing the feedback voltage signal to exceed a Zener breakdown voltage of the Zoner diode enables conduction of the transistor to thereby disable the laser-driving unit to protect the laser diode from output of excessive power.

2. The voltage dividing apparatus for preventing sudden increases in power to a laser diode as claimed in claim 1, wherein the laser-driving unit includes three bipolar junction transistors connected in series.

3. The voltage dividing apparatus for preventing sudden increases in power to a laser diode as claimed in claim 1, wherein the Zener breakdown voltage of the Zener diode is 1.2 volts.

4. A voltage dividing apparatus for preventing sudden increases in power to a laser diode, comprising:

a laser diode module, including:

a laser diode, for receiving a driving current to emit light; and a photo diode, for receiving light emitted from the laser diode and converting the received light into a voltage signal;

a feedback amplifying circuit having an input coupled to the photo diode for providing a feedback voltage signal responsive to the voltage signal from the photo diode to automatically balance power of the laser diode;

a laser-driving unit having an output connected to the laser diode, and a plurality of inputs coupled to an output of the feedback amplifying circuit for controlling a current of the laser diode responsive to the feedback voltage signal;

a voltage divider connected between the output of the feedback amplifying circuit and the plurality of inputs of the laser-driving unit for distributing the feedback voltage signal into each component of the laser-driving unit; and a feedback voltage monitoring circuit having an input coupled to the feedback amplifying circuit and an output coupled to the voltage divider and the laser-driving unit, the feedback voltage monitoring circuit including (a) a first transistor coupled to the voltage divider and a second transistor of the laser-driving unit, and (b) a Zener diode coupled between the output of the feedback amplifying circuit and the first transistor, wherein a short circuit causing the feedback voltage signal to exceed a Zener breakdown voltage of the Zener diode enables conduction of the first transistor to thereby disable the laser-driving unit by turning off the second transistor to protect the laser diode the from output excessive power.

5. The voltage dividing apparatus for preventing sudden increases in power to a laser diode as claimed in claim 4, wherein the laser-driving unit includes three bipolar junction transistors connected in series.

6. The voltage dividing apparatus for preventing sudden increases in power to a laser diode as claimed in claim 4, wherein the Zener breakdown voltage of the Zener diode is 1.2 volts.

\* \* \* \* \*